United States Patent [19]

Inami et al.

[11] Patent Number: 4,612,665
[45] Date of Patent: Sep. 16, 1986

[54] GRAPHIC EQUALIZER WITH SPECTRUM ANALYZER AND SYSTEM THEREOF

[75] Inventors: Mamoru Inami; Yoshiaki Tanaka, both of Yokohama, Japan

[73] Assignee: Victor Company of Japan, Ltd., Yokohama, Japan

[21] Appl. No.: 314,360

[22] Filed: Oct. 23, 1981

Related U.S. Application Data

[63] Continuation of Ser. No. 68,476, Aug. 20, 1979, abandoned.

[30] Foreign Application Priority Data

Aug. 21, 1978 [JP] Japan ............... 53-114525[U]

[51] Int. Cl.$^4$ ............... G01R 23/18; H03G 5/02; H04B 3/04
[52] U.S. Cl. ............... 381/98; 324/77 E; 333/28 R; 381/56; 381/103; 381/109
[58] Field of Search .......... 179/1 B, 1 D, 1 G, 1 GN, 179/1 MN, 1 SA, 1 SP, 1 VL; 333/18, 28 R, 28 T, 287; 84/464; 340/753; 381/56, 58, 98, 101, 103, 109; 324/77 B, 77 D, 77 E; 455/158, 159, 177, 200, 233

[56] References Cited

U.S. PATENT DOCUMENTS

| | | | |
|---|---|---|---|
| 3,676,595 | 7/1972 | Dolansky et al. | 179/1 SP |
| 3,732,370 | 5/1973 | Sacks | 179/1 D |
| 3,750,044 | 7/1973 | Stanley | 179/1 D |
| 3,892,921 | 7/1975 | Burkowitz | 179/1 MN |
| 4,118,601 | 10/1978 | Yeap | 179/1 D |
| 4,176,581 | 12/1979 | Stuyvenberg | 84/464 R |
| 4,186,274 | 1/1980 | Mayshar | 333/28 T |
| 4,307,340 | 12/1981 | Inami et al. | 381/58 |
| 4,359,601 | 11/1982 | England | 381/103 |
| 4,504,968 | 3/1985 | Kaneko et al. | 381/103 |

OTHER PUBLICATIONS

R. deJong & L. Simpson; "Playmaster Stereo Graphic Equalizer"; Electronics Australia; Feb. 1980; vol. 41, No. 11; pp. 50-60 & 63.
L. Robinson; "Graphic Level Display"; Practical Electronics; vol. 13, No. 1; Jan. 1977; p. 57.
R. Lawrence; "Stereo Digital PPM With LED Display"; Practical Electronics; vol. 12, No. 10; Oct. 1976; pp. 808-816.
H. Tremaine; *Audio Cyclopedia*; 1969; pp. 302-304, pp. 312-313.
"Radio-Electronics Tests Heath AD-1305 Equalizer"; Radio-Electronics; Dec. 1976; vol. 47, No. 12; pp. 65-67.

*Primary Examiner*—Gene Z. Rubinson
*Assistant Examiner*—Randall P. Myers
*Attorney, Agent, or Firm*—Michael N. Meller

[57] ABSTRACT

A graphic equalizer comprises an equalizer for separately level adjusting the input signal for each of a number of divided frequency bands which are different from each other, control knobs provided one for each of the divided frequency bands, which are operated for carrying out level adjusting of the equalizer, a spectrum analyzer supplied with the output signal of the equalizer and having a display for displaying the level of each of the divided frequency bands, and a casing provided with a panel face having the control knobs and the display section of the spectrum analyzer disposed in a corresponding relationship to each other and accommodating the equalizer and the spectrum analyzer therein.

11 Claims, 16 Drawing Figures

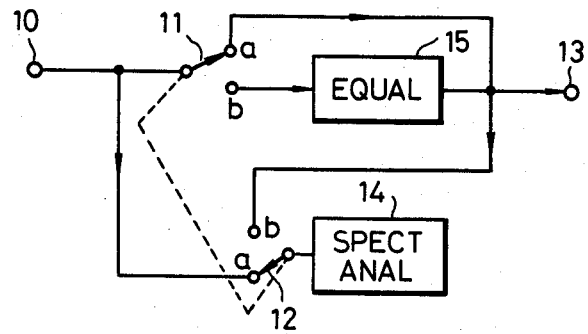
FIG. 1
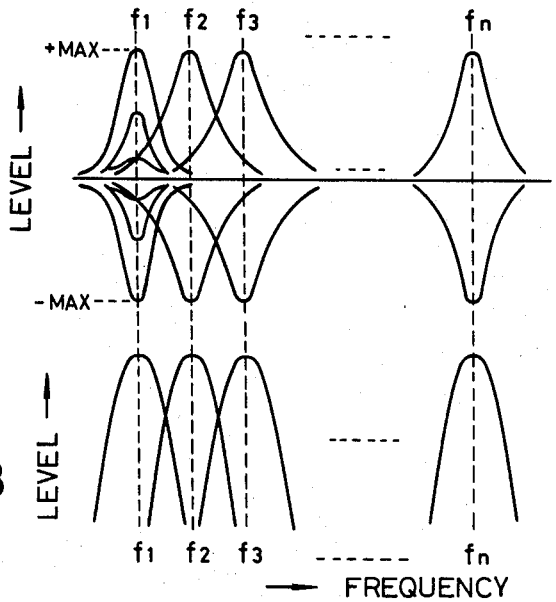
FIG. 2A
FIG. 2B
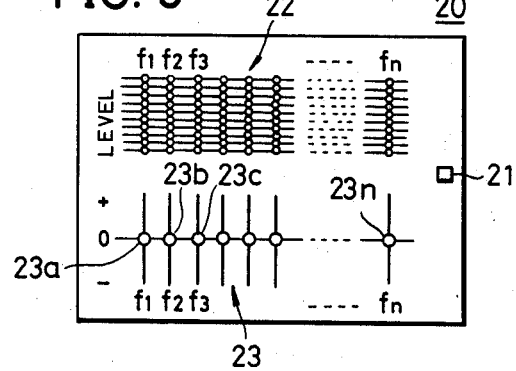
FIG. 3

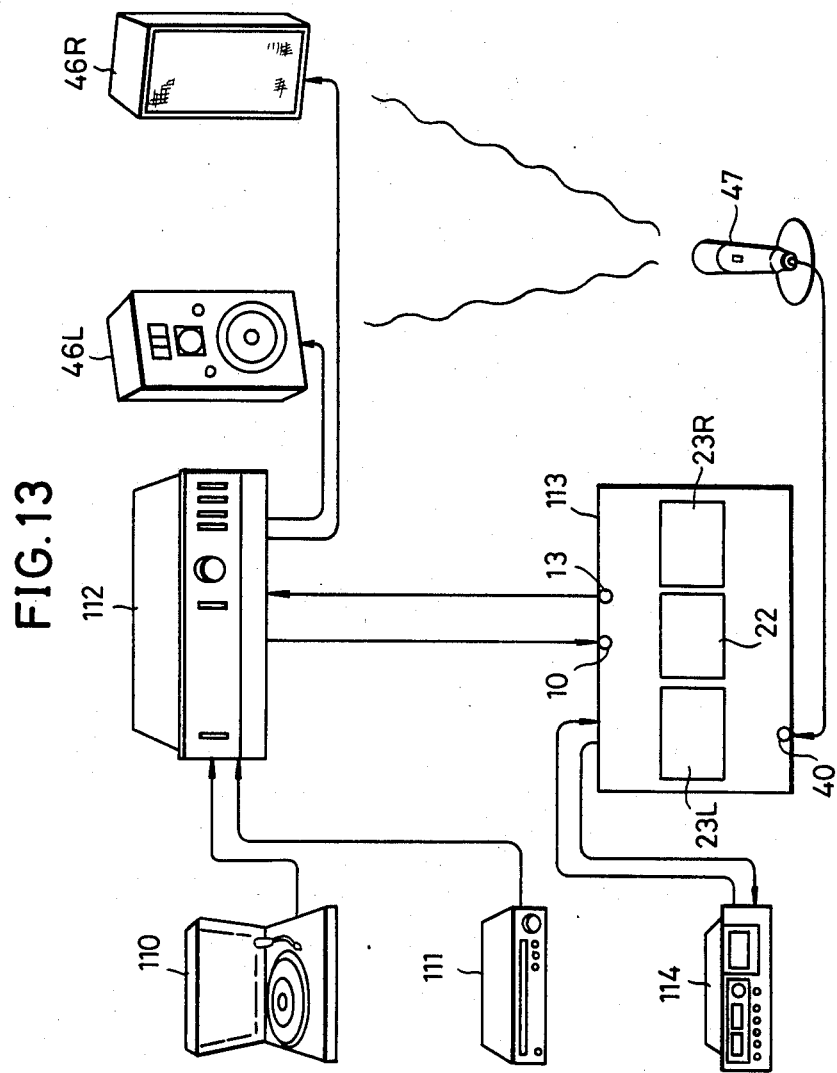

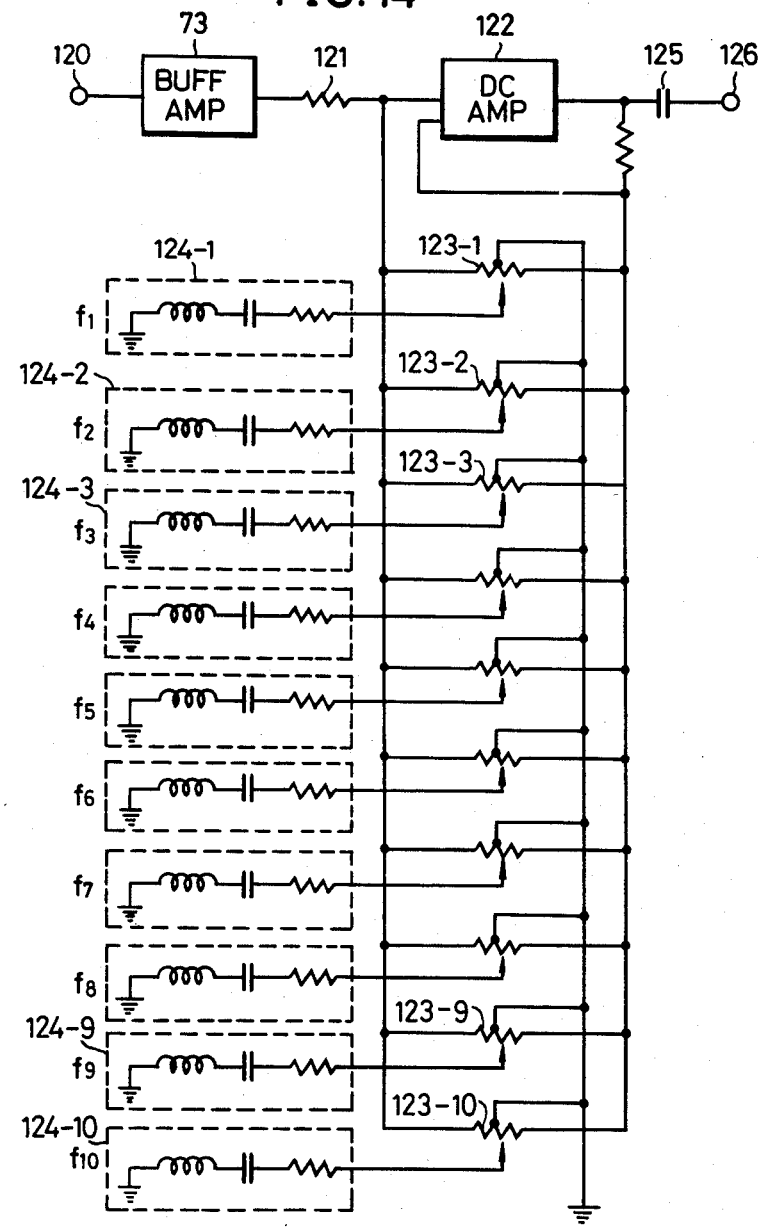

GRAPHIC EQUALIZER WITH SPECTRUM ANALYZER AND SYSTEM THEREOF

This application is a continuation of application Ser. No. 68,476, filed Aug. 20, 1979, now abandoned.

BACKGROUND OF THE INVENTION

The present invention relates to graphic equalizers with spectrum analyzers and systems thereof and more particularly to a graphic equalizer which is provided with a spectrum analyzer for displaying the spectrum of a signal, and which varies and adjusts the level of the signal for every divided frequency band as the spectrum display is observed and to a system for employing the graphic equalizer.

In general, it is desirable in some instances in the recording of an audio signal, when there is a sound unpleasant to the ear such as noise or the sound of the wind of a low constant frequency, to carry out the recording of the audio signal with lowered level of the frequency band in which these sounds are present. In the case where, in a reproducing apparatus, the fidelity of the reproduced audio signal is impaired by the effects of characteristics such as the frequency characteristics possessed by the audio components themselves such as the loudspeakers and the pickup cartridge and the transmission characteristic of the listening room, it is desirable in some instances to correct the level of a certain frequency band. Furthermore, there are instances where, in both recording and reproducing, the frequency characteristics are rendered into desired characteristics according to preference without flattening the frequency characteristics. In such cases, a graphic equalizer capable of variably adjusting the level of the signal for every divided frequency band is used.

Among graphic equalizers, there are those provided with a calibrated scale for indicating the adjustment level interrelatedly with the movement of a manipulating knob for adjusting the level for every band. In such a graphic equalizer, however, the degree of level adjustment with respect to the input signal can be determined, but the level of the signal after level adjustment cannot be accurately determined.

Accordingly, in accordance with the present invention, a spectrum analyzer is integrally incorporated within a graphic equalizer so that level adjustment can be carried out as the spectrum of the signal after it has passed through the graphic equalizer is observed. By this organization, since the level adjustment can be carried out as the level of the signal which has been actually adjusted is observed, the level adjustment can be carried out rapidly and accurately.

However, when the divided frequency bands which have been level adjusted by the graphic equalizer and the divided frequency bands indicated by the spectrum analyzer are different, accurate level adjustment cannot be carried out. Accordingly, according to the present invention, the center frequencies respectively of the divided frequency bands level adjusted by the graphic equalizer and the center frequencies respectively of the divided frequency bands indicated by the spectrum analyzer are caused to coincide. Furthermore, on the face of the manipulative control and indication display panel of the apparatus, the level adjustment control elements and the indication display units of the spectrum analyzer are disposed in respectively corresponding dispositions. By this arrangement, level adjustment can be carried out readily and accurately.

Still another difficulty arises in certain cases wherein, even when the frequency characteristics of the signal to be emitted as sound from the loudspeakers are satisfactory, the frequency characteristics of the sound emitted from the loudspeakers and actually reaching the ears of the listener in the sound field become different from the above mentioned satisfactory frequency characteristics in accordance with the characteristics of the sound field including also the characteristics of the loudspeakers.

Accordingly, in accordance with the present invention, means are provided and adapted to make possible adjustment so that the frequency characteristics of the actual sound at the listening position of the listener will become the desired frequency characteristics. For this purpose, the spectrum of the sound at the listening position of the listener is indicatively displayed by the spectrum analyzer, and level adjustment of the input audio signal is carried out by the graphic equalizer as the spectrum thus displayed is observed.

In addition, there are cases wherein only the transmission characteristic of a signal transmission system is known, and it is desired to transform this into a desired characteristic. The level of an ordinary input audio signal is continually fluctuating in every frequency band. Accordingly, in accordance with the present invention, a pink noise of equal energy distribution irrespective of frequency band is used in the adjustment of the transmission characteristic of the signal transmission system to the desired value.

SUMMARY OF THE INVENTION

Accordingly, it is a general object of the present invention to provide a novel and useful graphic equalizer with spectrum analyzer and a system thereof in which the above described difficulties and problems have been overcome.

Another and specific object of the invention is to provide a graphic equalizer in which is integrally combined a spectrum analyzer for indicatively displaying the spectrum of a signal which has passed through the equalizer. By this provision, the level of a desired divided band part with respect to a signal can be very readily and rapidly adjusted as the indication of the spectrum analyzer is observed.

Still another object of the invention is to provide a graphic equalizer with spectrum analyzer in which the level adjustment manipulative control elements of the graphic equalizer and the indication units of the spectrum analyzer are arranged with corresponding relationship.

A further object of the invention is to provide a graphic equalizer with spectrum analyzer capable of displaying spectrums with respect to signals of a plurality of channels with a single spectrum analyzer.

A further object of the invention is to provide a graphic equalizer system wherein the sound emitted from the loudspeakers is picked up by means of a microphone at the listening position of the listener and, after being passed through the equalizer, is caused to be displayed by the spectrum analyzer, and, as the resulting display is observed, the level of the input signal in each of the divided bands is adjusted. By this provision, level adjustment can be carried out in a manner to continually obtain a sound of a desirable characteristic at the listening position without being affected by the characteristics of the audio components such as the loudspeakers and the pickup cartridge and the characteristics of the sound field.

An additional object of the invention is to provide a graphic equalizer system in which, by supplying pink noise instead of an input audio signal, level adjustment can be carried out for every divided frequency band as the resulting spectrum display is observed. By this provision, adjustment of the signal transmission characteristics can be accomplished in a very accurate manner.

Other objects and further features of the invention will be apparent from the following detailed description with respect to preferred embodiments of the invention when read in conjunction with the accompanying drawings.

BRIEF DESCRIPTION OF THE DRAWINGS

In the drawings:

FIG. 1 is a block diagram of a first embodiment of the graphic equalizer with spectrum analyzer according to the invention;

FIGS. 2A and 2B are graphs respectively indicating the frequency level characteristics of a graphic equalizer and the filter characteristics of a spectrum analyzer;

FIGS. 3 and 4 are front views respectively showing examples of panel faces used in the graphic equalizer shown in FIG. 1;

FIG. 13 is a diagram indicating one example of connection of the graphic equalizer in a system in which the graphic equalizer of FIG. 11 is employed; and FIG. 14 is a circuit diagram of one embodiment of the circuit in concrete form of the equalizer illustrated in FIG. 11.

DETAILED DESCRIPTION

Figure 4:
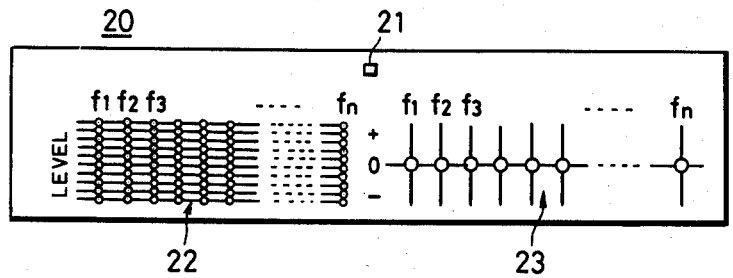

The first embodiment of the graphic equalizer with spectrum analyzer according to the present invention will first be described with reference to FIG. 1. An audio signal applied to an input terminal 10 is supplied to the movable contact of a switch 11 and a fixed contact point a of a switch 12. These switches are switched synchronously or interrelatedly, for example, by the manipulative actuation of a switch knob 21 provided on a panel face 20 of a casing which accommodates a spectrum analyzer and a graphic equalizer as shown in FIG. 3. When each of the switches 11 and 12 is in a state wherein its movable contact is switched to its contact point a, the input audio signal passes through the switch 11 to be led out through an output terminal 13 and, at the same time, is fed through the switch 12 to a spectrum analyzer 14.

This spectrum analyzer 14 has a band-pass filter characteristic as indicated in FIG. 2B. In the case where the filter of this spectrum analyzer 14 is constituted by a ½-octave band-pass filter, the center frequencies $f_1, f_2, f_3, \ldots f_n$ of the pass bands of band-pass characteristic are, for example, 16 Hz, 22.4 Hz, 31.5 Hz, 45 Hz, 63 Hz, 90 Hz, 125 Hz, 180 Hz, 250 Hz, 355 Hz, 500 Hz, 710 Hz, 1,000 Hz, 1,400 Hz, 2,000 Hz, 2,800 Hz, 4,000 Hz, 5,600 Hz, 8,000 Hz, 11,200 Hz, and 16,000 Hz, (n=20).

The spectrum analyzer 14 per se is well known and is accommodated within the casing accommodating the graphic equalizer 15. The levels of the bands of the above mentioned center frequencies of the audio signal fed to the spectrum analyzer 14 are displayed at a display section 22 on the panel face 20. In this display section 22, a plurality of light-emitting elements are vertically alined for each of the above mentioned bands. These light-emitting elements carry out light-bar or light-spot displaying in response to the display levels.

By merely observing the display section 22, the user of the sound apparatus can readily perceive the bands of the input audio signal whose levels differ from their respective desired levels.

Upon level adjusting, the user manipulates the switch knob 21 to switch the movable contacts of the switches 11 and 12 over to their respective contact points b. The input audio signal introduced through the input terminal 10 thereupon is fed through the switch 11 to a graphic equalizer 15. The resulting output signal of this equalizer 15 is led out through the output terminal 13 and, at the same time, is fed by way of the switch 12 to the spectrum analyzer 14. At this time, the states of the levels of all bands of the audio signal after being level adjusted by the equalizer 15 are displayed at the display section 22 of the spectrum analyzer 14.

The panel face 20 is also provided with a manipulative control section 23 provided with control knobs $23a$, $23b, \ldots 23n$ as shown in FIG. 3. The levels of the various bands of the graphic equalizer 15 are variably controlled as indicated in FIG. 2A by manipulation of these knobs $23a, 23b, \ldots 23n$. More specifically, by the manipulation of the knobs $23a$ through $23n$, the signal levels of the divided bands having equal center frequencies at the center frequencies $f_1$ through $f_n$ of the above mentioned divided bands are increased or decreased. The maximum quantities of this increase and decrease are respectively designated by +MAX and −MAX. The equalizer 15 is so adapted that it is level adjusted by the up-and-down movements of the knobs $23a$ through $23n$. The positions of these knobs in their ranges of movement are indicative of their respective quantities of level adjustment. Accordingly, calibrations of the same unit (for example, decibel (dB)) as the display section 22 are inscribed on the panel face alongside these knobs.

The user manipulates the knobs $23a$ through $23n$ as he observes the display section 22 of the spectrum analyzer 14 and carries out level adjustment so that the levels of the various divided bands indicated at the display section 22 assume their desired states. As a result, a signal thus level adjusted with its frequency characteristics adjusted as desired is led out through the output terminal 13.

While the display section 22 is disposed directly above and in vertical alignment with the control section 23 in the example illustrated in FIG. 3, these sections 22 and 23 may be disposed side-by-side as, for example, in the example shown in FIG. 4. In FIG. 4, those parts which are the same as corresponding parts in FIG. 3 are respectively designated by like reference numerals. Description of these parts will be omitted.

In each of the panel faces shown in FIGS. 3 and 4, the display of the divided bands of the display section 22 and the knobs 23a through 23n are disposed in respectively corresponding arrangement. For this reason, surveillance of the level display and manipulative control of the levels can be carried out easily and accurately.

Figure 5:
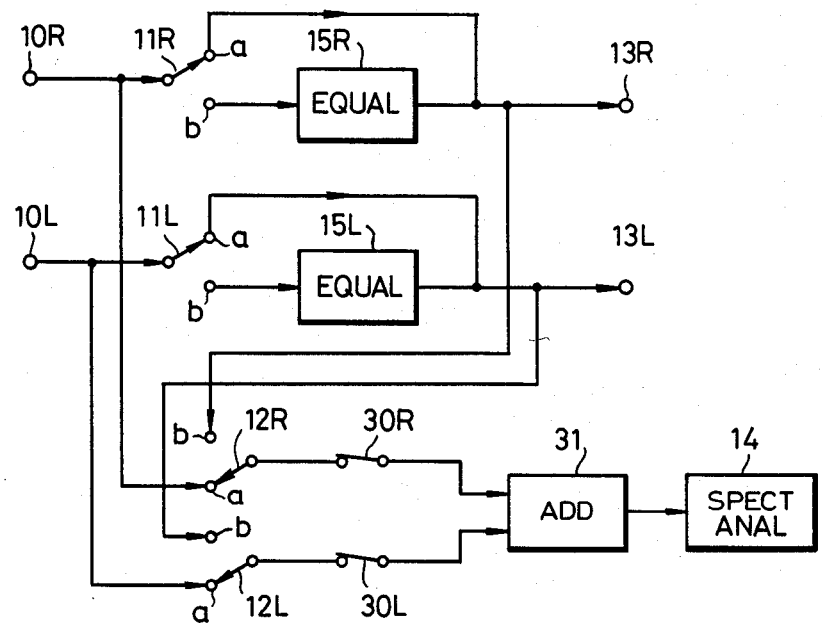
FIG. 5 is a block diagram of a second embodiment of the graphic equalizer with spectrum analyzer according to the invention.

The second embodiment of the graphic equalizer according to the invention will now be described in conjunction with FIG. 5. In the case where the above described preceding embodiment of the invention is used as it is for multiple-channel signals, the circuit of the block system shown in FIG. 1 is required in the corresponding plural number. In this case, simultaneous surveillance of the display sections of the plural number of spectrum analyzers is difficult. Other problems such as the difficulty of keeping the size of the apparatus small and high cost also arise. Accordingly, in the present embodiment of the invention, these problems are overcome by a circuit organization wherein displaying can be carried out by using one spectrum analyzer for multiple-channel signals as, for example, two-channel stereo signals. In FIG. 5, those parts which are the same as corresponding parts in FIG. 1 are designated by like reference numerals, to which subscripts R and L are appended to indicate respectively right and left channel signal systems.

Figure 6:
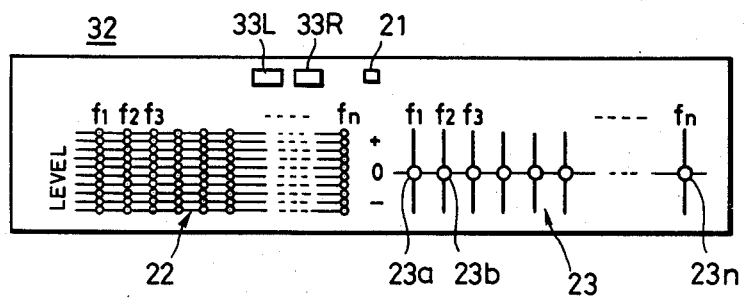
FIG. 6 is a front view of one example of a panel face used in the graphic equalizer illustrated in FIG. 5.

When switches 11R, 11L, 12R, and 12L are in their states wherein their movable contacts are respectively in contact with their contact points a, as illustrated in FIG. 5, right and left channel input audio signals introduced through input terminals 10R and 10L pass respectively through the switches 11R and 11L and are led out through output terminals 13R and 13L. At the same time, these right and left channel input audio signals are fed by way of the switches 12R and 12L and further by way of closed switches 30R and 30L to an adder 31, where they are combined into a single signal. The resulting output signal of the adder 31 is fed to a spectrum analyzer 14 and displayed in the display section 22 of a panel face 32 as shown in FIG. 6.

Thus, according to the present embodiment of the invention, the right and left channel signals are combined and then displayed. For this reason, a single spectrum analyzer is sufficient. Therefore, surveillance of the spectrum is facilitated, the apparatus can be made small and compact.

In the case where the displaying of only the right channel signal is to be carried out, a switch knob 33L on the panel face 32 is manipulated to open the switch 30L. Similarly, when displaying of only the left channel signal is to be carried out, a switch knob 33R is manipulated to open the switch 30R.

In the present embodiment of the invention, instead of the adder 31, a maximum level selector which selectively produces as output the channel signal of higher level of the input right and left channel signals may be used. In the case where surveillance of the variation of the averaged sound volume of the input signals is necessary, the above described adder is used. However, when at the time of recording on a tape, for example, it is necessary to control the peak value of the signal level so that it does not exceed the saturation level, the level of either of the signals of the left and right channels also must not exceed the maximum saturation level. For this reason, a maximum level selector is used instead of the adder 31 as mentioned above.

The operation in the case where the switch 21 is manipulated to switch the movable contacts of the switches 11R, 11L, 12R, and 12L respectively over to their contact points b can be readily understood from the foregoing description, and therefore description of this operation will be omitted. Level adjustment of the equalizers 15R and 15L is accomplished by up-and-down sliding adjustment manipulation of the control knobs 23a through 23n. In the present embodiment of the invention, the level adjustment is carried out simultaneously with respect to the two equalizers 15R and 15L by a common single set of control knobs 23a through 23n. For this reason, the organization of the apparatus is simple, and its size can be made small. In the case where it is desirable to level adjust the equalizers 15R and 15L separately, separate sets of control knobs respectively for exclusive use for the equalizers 15R and 15L are provided as in the embodiment of the invention described hereinafter.

In each of the above described preceding embodiments of the invention, supplying is carried out to display by switching, to the spectrum analyzer 14, the input audio signal itself and the input audio signal which has passed through an equalizer. However, the signal of the sound emitted from the loudspeakers in the sound field of the listening room and actually reaching the ears of the listener and the input audio signal are not necessarily identical due to effects of characteristics of speakers, and sound transmission characteristic of a listening room etc. Accordingly, it is desirable that the above described level adjustment is carried out with the sound actually reaching the ears of the listener as a standard.

Figure 7:
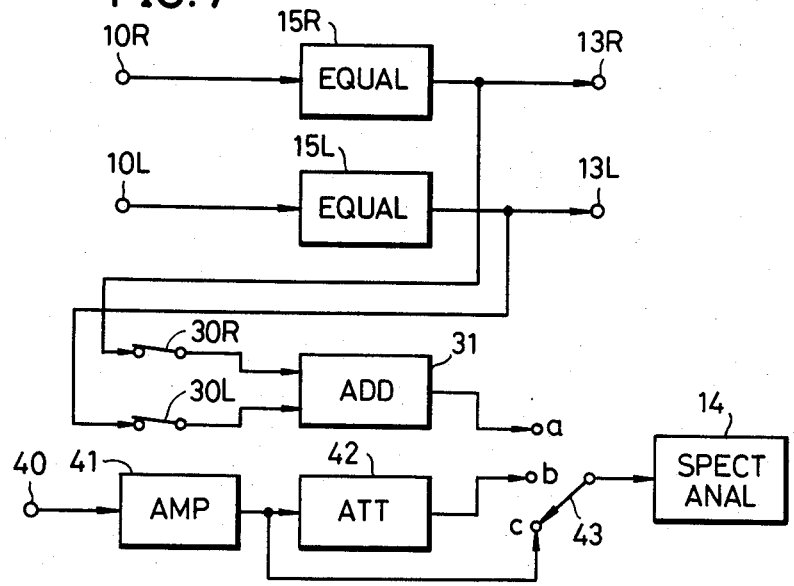
FIG. 7 is a block diagram of a third embodiment of the graphic equalizer with spectrum analyzer according to the invention.

An embodiment of the invention in which this has been realized will now be described with reference to FIGS. 7, 8, and 9. In FIGS. 7 and 9, those parts which are the same as corresponding parts in FIGS. 5 and 6 are designated by like reference numerals. Description of such parts will be omitted.

Referring first to FIG. 7, input audio signals of right and left channels entering through input terminals 10R and 10L pass through equalizers 15R and 15L and are led out through output terminals 13R and 13L. Then, when the movable contact of a switch 43 is connected to a contact point a thereof, the output signal of the equalizers 15R and 15L are supplied through switches 30R and 30L to an adder 31 similarly as in the preceding embodiment of the invention, and the resulting output signal of the adder 31 is fed to a spectrum analyzer 14 and is displayed in the display section 22 of a panel face 50 as shown in FIG. 9.

Figure 8:
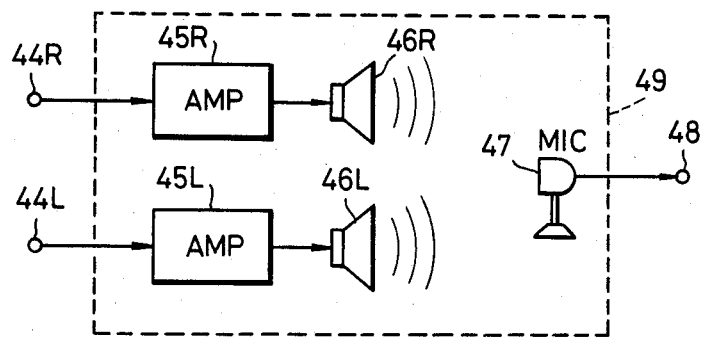
FIG. 8 is a schematic diagram for a description of the state in which sound reproduced by loudspeakers is picked up by a microphone in a system in which the graphic equalizer of FIG. 7 is employed.
Figure 9:
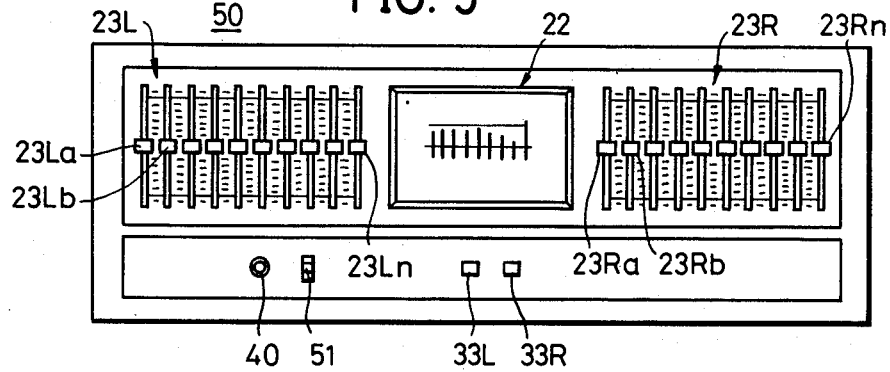
FIG. 9 is a front view of one example of a panel face used in the graphic equalizer shown in FIG. 7.

The signals led out through the output terminals 13R and 13L are applied to terminals 44R and 44L shown in FIG. 8 and supplied through amplifiers 45R and 45L to loudspeakers 46R and 46L, which thereby emit corresponding sounds. In a sound field 49 formed by the sounds from the loudspeakers 46R and 46L within a listening room, a microphone 47 is placed in the listening position of a listener thereby to pick up the sounds from the loudspeakers 46R and 46L. The audio signal from the microphone 47 is applied through a terminal 48 to a terminal 40 as shown in FIG. 7.

The signal thus applied to the terminal 40 is passed through an amplifier 41 and is applied, on one hand, by way of an attenuator 42 to a contact point b of the aforementioned switch 43 and, on another hand, directly to a contact point c of the same switch 43. By manipulating a switch knob 51 on the panel face 50 and connecting the movable contact of the switch 43 to its contact point b or c, the audio signal from the microphone 47 is supplied to the spectrum analyzer 14 and displayed in the display section 22. When the movable contact of the switch 43 is connected to its contact point b, and the display in the display section 22 exceeds the maximum display level, the switch 43 is switched to its contact point c thereby to supply the signal attenuated by the attenuator 42 to the spectrum analyzer 14.

Accordingly, by carrying out level adjustment by independently manipulating control knobs 23Ra through 23Rn and 23La through 23Ln of the equalizers 15R and 15L as the display in the display section 22 is observed, optimum level adjustment with respect to all channels can be carried out in accordance with the actual state at the listening position of the listener in the sound field.

In this connection, the microphone 47 may be installed in a built-in state in the pannel 50. Furthermore, the number of channels is not limited to two.

Figure 10:
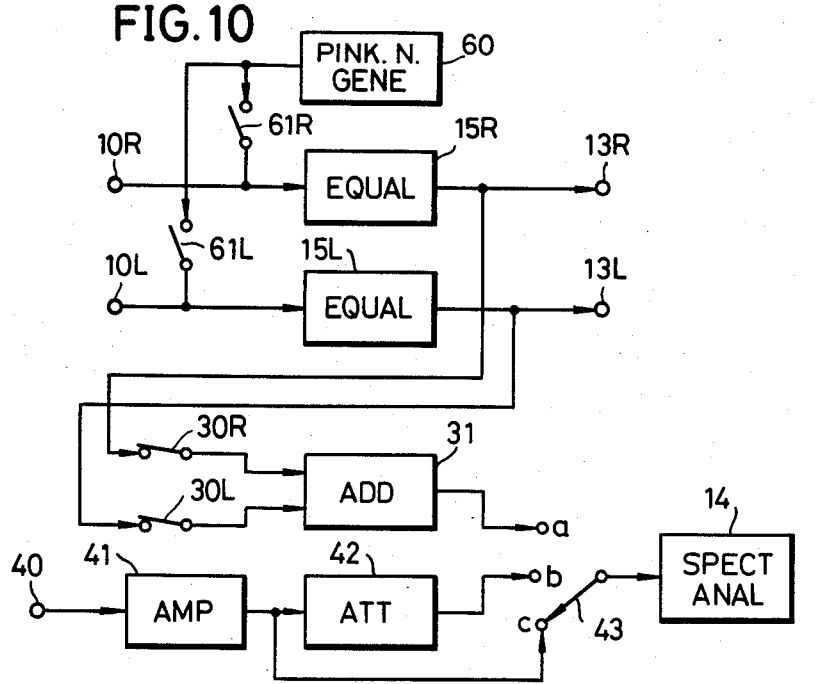
FIG. 10 is a block diagram of a fourth embodiment of the graphic equalizer with spectrum analyzer according to the invention.

A fourth embodiment of a graphic equalizer provided with a spectrum analyzer according to the present invention will be described in conjunction with FIG. 10. In FIG. 10, those parts which are the same as corresponding parts in FIG. 7 are designated by like reference numerals. Detailed description of such parts will be omitted.

For level adjustment operation, the present embodiment is adapted to use a pink noise instead of an input audio signal. Since pink noise has an energy distribution which is always uniform over the entire frequency band, level adjustment can be accomplished more accurately than in the case of employing an audio signal having a constantly fluctuating level.

Referring to FIG. 10, a pink noise generator 60 generates pink noise which is supplied through switches 61R and 61L to the equalizers 15R and 15L respectively. At this time, there is, of course, no audio signal applied to the input terminals 10R and 10L. The pink noise signal which has passed through the equalizers 15R and 15L is emitted from the speaker as sound, which is picked up by a microphone and is displayed on the display section 22 of the spectrum analyzer 14. While observing this display, the operator adjusts the level for each of the divided frequency bands by means of the equalizers 15R and 15L. This level adjusting operation is exactly the same as that in the above described embodiment.

In the pink noise generator 60, the pink noise is generated by the well-known method of passing white noise through a pink noise filter.

When level adjustment is to be carried out independently for the right- and left-channels, the following procedure is used. The switch 61R is closed causing pink noise to emit from the right-channel speaker and the level is adjusted for the right-channel. Then, the switch 61R is opened and the switch 61L is closed and the level is adjusted for the left-channel. The adjustment may, of course, be made in reverse order.

In the above described level adjusting operation, it is possible to use a signal reproduced from a frequency record or a warble tone instead of pink noise. However, the use of pink noise is preferred, because pink noise is uniform over the entire frequency band and this makes it possible to instantly recognize the overall transfer frequency characteristics and to carry out the level adjustment over the entire frequency range very quickly.

Figure 11:
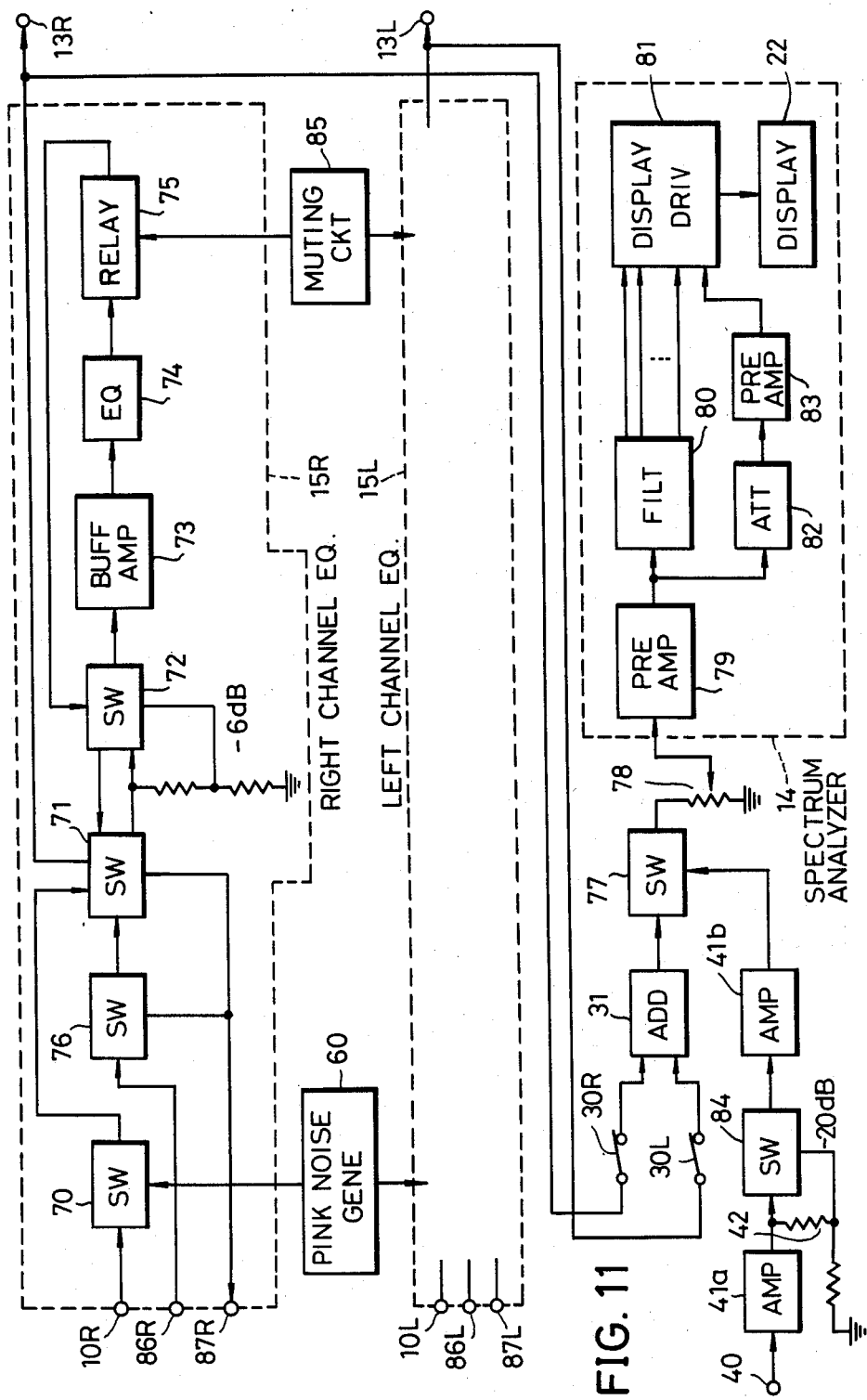
FIG. 11 is a diagram of one embodiment of a block system which is in an even more concrete form of the block system shown in FIG. 10.

Next, a description of a more concrete form of the graphic equalizer provided with spectrum analyzer indicated in FIG. 10 is given in conjunction with one embodiment shown in block diagram in FIG. 11. Parts in FIG. 11 which corresponds to parts in FIG. 10 are designated by like reference numerals. As the left-channel equalizer 15L is identical with the right-channel equalizer 15R, it is not illustrated in detail in the figure and description thereof is omitted here.

Figure 12A:
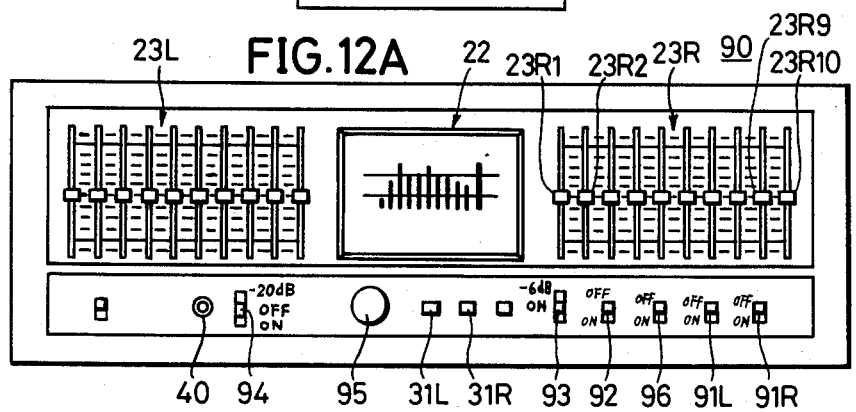
FIGS. 12A and 12B are respectively a front view of the panel face of the apparatus shown in FIG. 11 and an enlarged view of the display part of the spectrum analyzer.

When the spectrum of the input signal is to be displayed on the spectrum analyzer 14, pink noise switch knobs 91R and 91L disposed on a panel 90 shown in FIG. 12A are set to OFF position. This puts a switch 70 in a position which allows the signal introduced from the input terminal 10R to pass therethrough. Another switch knob 92 is set to ON, putting a switch 71 in a position which causes the signal from the switch 70 to pass to a switch 72 and then pass from the switch 72 to the output terminal 13R. Moreover, when a switch knob 93 is set to ON, the switch 72 passes the signal from the switch 71 to a buffer amplifier 73 and passes the signal from a relay 75 to the switch 71. When the input signal is abnormally large the knob 93 is set to the −6 dB position, whereby the input signal level is attenuated to one half. Further, when a microphone switch knob 94 is set to OFF, a switch 77 is changed to a position which allows the output signal of the adder 31 to pass therethrough.

The input audio signal introduced through the input terminal 10R passes successively through the switches 70, 71, and 72 and is then fed to the buffer amplifier 73. The output signal of the amplifier 73 is supplied to an equalizer 74 described later, where it is level adjusted for each divided frequency band. The level-adjusted signal passes through the relay 75 and then the switch 71 and is led out through the output terminal 13R. The relay 75 is normally closed and is opened at the time when the muting circuit 85 is in operation.

The output signal passed from the switch 71 and led out through the terminal 13R is supplied through the switch 30R to the adder 31, where it is added with the left-channel signal being supplied thereto by way of the switch 30L. The resulting output signal passes through the switch 77 and a variable resistor 78 for level adjustment which is controlled by a knob 95, and is then supplied to a pre-amplifier 79.

Figure 12B:
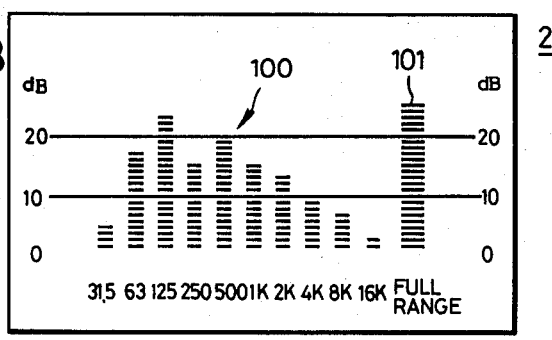

The resulting output signal from the pre-amplifier 79 is supplied to a filter 80, where it is frequency divided into specific frequency band signals which are then supplied to a display driving circuit 81. Accordingly, each signal is displayed by bar-graph indication 100 on the display section 22 shown in FIG. 12B. On the other hand, the signal from the pre-amplifier is supplied by way of an attenuator 82 and a pre-amplifier 83 to the display driving circuit 81. On the display section 22 shown in FIG. 12B, a bar-graph indication 101 shows the level for the full range (the overall frequency band).

The above described display operation is carried out, for example, with the components electrically connected as indicated in FIG. 13. Either a record player 110 or a tuner 111 is connected to a pre-main-amplifier 112. The pre-main-amplifier 112 is connected to the input terminal 10 and the output terminal 13 of the graphic equalizer provided with the spectrum analyzer of the present invention. The output terminals of the pre-main-amplifier 112 are connected to the speakers 46R and 46L.

With the components connected as described above, the operator vertically slides the respective control knobs in control knob sections 23R and 23L while observing the display section 22. Accordingly, the output of the equalizer 74 is adjusted for each divided frequency band so that the speakers 46R and 46L are made capable of producing sound having the desired characteristics.

When the frequency characteristics of the sound at a particular listening position are to be adjusted, the microphone 47 is connected to the terminal 40, and the knob 94 is set to ON position. This causes the switch 77 to change to a position which allows the signal from the amplifier 41b to pass therethrough and puts the switch 84 in a position which allows the signal from the amplifier 41a to pass therethrough as it is.

When the level of the signal from the microphone 47 is too high, the control knob 94 is set to the −20 dB position and the level of the signal passing through the switch 84 is attenuated by −20 dB.

The sound signal from the speakers 46R and 46L picked up by the microphone 47 is introduced through the terminal 40 and then passes through the amplifier 41a, the switch 84, and the amplifier 41b. The signal from the amplifier 41b passes through the switch 77 and is supplied by way of the variable resistor 78 to the spectrum analyzer 14, where it is level displayed on the display section 22 thereof. The operator adjusts the level in the equalizer while observing the display section 22.

When pink noise is to be used instead of an input audio signal as the signal emitted from the speakers, the switch knobs 91R and 91L are set to their ON positions. This allows the switch 70 to pass the pink noise from the pink noise generator 60. Accordingly, instead of the input audio signal, the pink noise passes through the switch 70, and then further passes through the switches 71 and 72, and is thereafter supplied to the buffer amplifier 73. Thereafter, similarly as in the preceding case, the pink noise is led out through the output terminals 13R and 13L (13) and is then emitted as sound from the speakers 46R and 46L.

For independent level adjustment of the right- and left-channels, one or the other of the control knobs 91R and 91L is set to ON position.

Here, the microphone 47 is directed along a line bisecting the angle formed between the speakers 46R and 46L and itself. In carrying out the level adjustment for each channel, it is not necessary to direct the microphone 47 toward the speaker which is emitting sound. The microphone 47 needs not be a two-channel microphone and any monaural microphone may be used.

Terminals 86R and 86L are input terminals through which the reproduced signal from a tape deck 114 is introduced. Other terminals 87R and 87L are output terminals through which a signal to be recorded by the tape deck 114 is led out. The switch 76 is changed over by the operation of the switch control knob 96.

The table below shows the relationship between the on-off state of the control knobs 92 and 96 and the signal derived from the terminals 87R and 13R.

| control knob 96 (switch 76) | control knob 92 (switch 71) | signal at terminal 87R | signal at terminal 13R |
|---|---|---|---|
| OFF | OFF | input signal from terminal 10R<br>control knob 93 (switch 72) inoperational | input signal<br>control knob 93 (switch 72) capable of ON-OFF operation |
| ON | OFF | input signal<br>control knob 93 (switch 72) inoperational | reproduced signal from terminal 86R<br>control knob 93 (switch 72) capable of ON-OFF operation |
| ON | ON | input signal<br>control knob 93 (switch 72) capable of ON-OFF operation | reproduced signal<br>control knob 93 (switch 72) inoperational |
| OFF | ON | input signal<br>control knob 93 (switch 72) capable of ON-OFF operation | input signal<br>control knob 93 (switch 72) capable of ON-OFF operation |

Particularly in the case of recording on a cassette tape, there is a tendency for the signal to distort at higher frequencies. Accordingly, to avoid signal distortion it is preferrable to record with the level attenuated by −2 dB at 8 KHz and by −4 dB at 16 KHz and to reproduce with the level increased by +2 dB at 8 KHz and by +4 dB at 16 KHz. Conversely, in order to lower tape hiss noise, signals above 4 KHz can be recorded with the level increased by +4 dB and reproduced with the level attenuated by −4 dB.

FIG. 14 shows the concrete circuit configuration for one embodiment of the above described equalizer 74. In the same figure, the signal from the switch 72 is introduced through an input terminal 120 and is supplied by way of the DC buffer amplifier 73 and a resistor 121 to a DC amplifier 122. Variable resistors 123-1, 123-2, ... , 123-10 in parallel connection are connected across the DC amplifier 122. Between sliders of the variable resistors 123-1, 123-2, ... , 123-10 and the ground are respectively connected resonance circuits 124-1, 124-2, ... , 124-10, each of which comprises a resistor, a capacitor, and a coil connected in series.

In the present embodiment, the filter 80 in the spectrum analyzer 14 is an octave band-pass filter whose central frequencies $f_1, f_2, \ldots, f_{10}$ of the respective divided frequency bands are set to 31.5 Hz, 63 Hz, 125 Hz, 250 Hz, 500 Hz, 1 KHz, 2 KHz, 4 KHz, 8 KHz, and 16 KHz. The resonance frequencies $f_1, f_2, \ldots, f_{10}$ of the resonance circuits 124-1, 124-2, ... , 124-10 are set to coincide with the central frequencies $f_1$ through $f_{10}$. The variable resistors 123-1 through 123-10 are adjusted by manipulating the control knobs 23R1, 23R2, ... , 23R10 on the control section 23R. As a result of this adjustment of the variable resistors 123-1 through 123-10, the signals of the respective divided frequency bands are independently level adjusted with the frequencies $f_1$ through $f_{10}$ as their center frequencies. These independently level adjusted frequencies are led out by way of a capacitor 125 and an output terminal 126, and are then sent to the relay 75.

The configuration and operation of the circuit of the equalizer for the left-channel system are the same as the above and description thereof will be omitted.

Moreover, in the spectrum analyzer 14, the amount of attenuation in the attenuator 82 is selected to be such that, when pink noise is being displayed on the display section 22, the level of the entire frequency band of the pink noise passed through the attenuator 82 and displayed by the full range indication 101 is equal to the levels of each of the divided frequency bands pink noise indicated by each of band indications 100. In the present embodiment, the amount of attenuation in the attenuator 82 is set to around 18 dB. Accordingly, in the equalizer adjusting operation by sliding the control knobs on the control sections 23R and 23L, the level of indication 100 coincides with the level of indication 101 on the display section 22. Consequently, the adjusting operation can be carried out with ease. The signal processing means may be in the form of a maximum level selector adapted to pass the signal having the greatest amplitude among a plurality of signals.

Further, this invention is not limited to these embodiments but various variations and modifications may be made without departing from the scope of the invention.

What is claimed is:

1. A graphic equalizer comprising:
   (a) a first equalizer for separately level adjusting a first input signal for each of a number of divided frequency bands, producing a first output signal, said divided frequency bands being different from each other;
   (b) control means, one for each of said divided frequency bands, for carrying out level adjusting of said first equalizer;
   (c) control knobs provided one for each of said divided frequency bands for manually controlling said control means;
   (d) a spectrum analyzer having a display section for separately displaying said first output signal for each of a number of divided frequency bands, wherein said divided frequency bands are the same frequency bands for which said first input signal is level adjusted in said first equalizer; and
   (e) a casing provided with a panel face having said control knobs and said display section of said spectrum analyzer and accommodating said first equalizer and said spectrum analyzer therein, said control knobs being positioned on said panel face in correspondence with said display section for each of said divided frequency bands.

2. A graphic equalizer according to claim 1, wherein said equalizer comprises a buffer amplifier, a first resistor, a dc amplifier, and a capacitor connected in series between the input and output terminals, said dc amplifier having a first and a second input terminal and an output terminal; a second resistor coupled to said second input terminal and said output terminal; a plurality of variable resistors coupled in parallel to said first and second input terminal of said dc amplifier, each of said variable resistors being coupled to a common reference potential; and a plurality of tuned circuits, each of which is coupled to the slider of one of said variable resistors and to a reference potential.

3. A graphic equalizer according to claim 1, wherein:
   (a) a second equalizer is provided for separately level adjusting a second input signal for each of a number of divided frequency bands, producing a second output signal, said divided fequency bands being the same frequency bands into which said first input signal was divided by said first equalizer;
   (b) level adjustment of said second equalizer is carried out by said control means;
   (c) first signal processing means is provided for selectively outputting to said spectrum analyzer at any given point in time either said first output signal, said second output signal, or a sum of said first and second output signals in response to a mode selection switch operated manually.

4. A graphic equalizer as in claim 3 wherein said first signal processing means comprises an adding circuit for obtaining the sum of said first and second output signals, and switching means for selectively outputting to said spectrum analyzer either said first output signal, said second output signal, or said sum of said first and second output signals.

5. A graphic equalizer as in claim 3 wherein the center frequencies of the respective divided frequency bands in said first and second equalizers are respectively substantially equal to the center frequencies of the respective divided frequency bands in said spectrum analyzer.

6. A graphic equalizer as in claim 3 wherein:
   (a) a first speaker is supplied with said first output signal and emits said first output signal as sound;
   (b) a second speaker is supplied with said second output signal and emits said second output signal as sound;
   (c) a microphone picks up the sound emitted by said first and second speakers and propagated through a sound field; and
   (d) second signal processing means is provided for inputting the signal from said microphone to said spectrum analyzer.

7. A graphic equalizer as in claim 6 wherein said second signal processing means comprises an amplifier, an attenuator, and switching means means for supplying the input terminal of said spectrum analyzer with either the output signal of said first signal processing means or the output signal of said amplifier or the output signal of said attenuator.

8. A graphic equalizer as in claim 3 wherein said first and second input signals are generated by a pink noise generator.

9. A graphic equalizer according to claim 3, wherein said control means comprises first and second control means, one for each of said first and second equalizers, respectively, for carrying out level adjusting of said first and second equalizers.

10. A graphic equalizer according to claim 1, wherein switching means is provided for switching and supplying said first input signal to said spectrum analyzer when carrying out said level adjusting of said first equalizer by said control means.

11. A graphic equalizer according to claim 1, wherein:
   (a) a second equalizer is provided for separately level adjusting a second input signal for each of a number of divided frequency bands, producing a second output signal, said divided frequency bands being the same frequency bands into which said first input signal was divided by said first equalizer;
   (b) level adjustment of said second equalizer is carried out by said control means;
   (c) first signal processing means is provided for selectively outputting to said spectrum analyzer at any given point in time either said first input signal, said second input signal, or sum of said first and second input signals in response to a mode selection switch.

* * * * *